United States Patent
Sugimori et al.

(10) Patent No.: US 7,093,357 B2
(45) Date of Patent: Aug. 22, 2006

(54) METHOD FOR MANUFACTURING AN ELECTRONIC COMPONENT

(75) Inventors: Masanobu Sugimori, Toyama-ken (JP); Kenichi Nakamura, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 202 days.

(21) Appl. No.: 10/780,419

(22) Filed: Feb. 17, 2004

(65) Prior Publication Data

US 2004/0201325 A1    Oct. 14, 2004

Related U.S. Application Data

(62) Division of application No. 10/006,698, filed on Dec. 10, 2001, now abandoned.

(30) Foreign Application Priority Data

Jan. 29, 2001    (JP)    .............................. 2001-019828

(51) Int. Cl.
*H01R 43/00*    (2006.01)
*H01L 41/04*    (2006.01)
(52) U.S. Cl. ..................... 29/854; 29/832; 29/835; 29/838; 310/344
(58) Field of Classification Search ............... 29/25.35, 29/424, 838, 854, 835, 832; 310/344, 348, 310/351, 353, 321
See application file for complete search history.

(56) References Cited

U.S. PATENT DOCUMENTS

| 2,447,160 | A |  | 8/1948  | Chalfin |
| 2,699,508 | A |  | 1/1955  | Fastenau, Jr. |
| 3,747,176 | A | * | 7/1973  | Toyoshima ................ 29/25.35 |
| 3,849,681 | A |  | 11/1974 | Scott et al. |
| 5,166,570 | A |  | 11/1992 | Takahashi et al. |
| 5,184,043 | A | * | 2/1993  | Yoshinaga .................. 310/320 |
| 5,596,244 | A | * | 1/1997  | Kugou et al. ............... 310/348 |
| 5,808,397 | A |  | 9/1998  | Kotani |
| 5,839,178 | A |  | 11/1998 | Yoshida et al. |
| 5,982,076 | A |  | 11/1999 | Kim et al. |
| 6,005,329 | A | * | 12/1999 | Ikeda et al. ................. 310/340 |
| 6,087,763 | A |  | 7/2000  | Kim et al. |
| 6,204,593 | B1 |  | 3/2001  | Takahashi et al. |
| 6,307,305 | B1 |  | 10/2001 | Yoshio et al. |

FOREIGN PATENT DOCUMENTS

CN    1119371 A    3/1996

(Continued)

*Primary Examiner*—A. Dexter Tugbang
*Assistant Examiner*—Tai Van Nguyen
(74) *Attorney, Agent, or Firm*—Keating & Bennett, LLP

(57) ABSTRACT

A method for manufacturing an electronic component including the steps of preparing a pair of substantially round conductive wires, bending one end portion of each of the pair of conductive wires outward at an angle of about 90 degrees, forming a flat portion on each of the pair of substantially round conductive wires by press extending at least the portion on the tip side from the bending point so as to be extended substantially parallel to a lead portion of the lead terminal, such that a thickness of the flat portion is less than a diameter of each of the pair of substantially round conductive wires, forming a cup-shaped holder portion by bending the flat portion inwards, holding both end portions of a piezoelectric element in a pair of the cup-shaped holder portions, and electrically and mechanically connecting the cup-shaped holder portions and the electrodes formed in both end portions of the piezoelectric element by using a conductive joining material.

11 Claims, 4 Drawing Sheets

FOREIGN PATENT DOCUMENTS

| | | |
|---|---|---|
| JP | 61-121023 | 7/1986 |
| JP | 63-161708 | 5/1988 |
| JP | 5-33847 | 5/1993 |
| JP | 2000-114913 | 4/2000 |

* cited by examiner

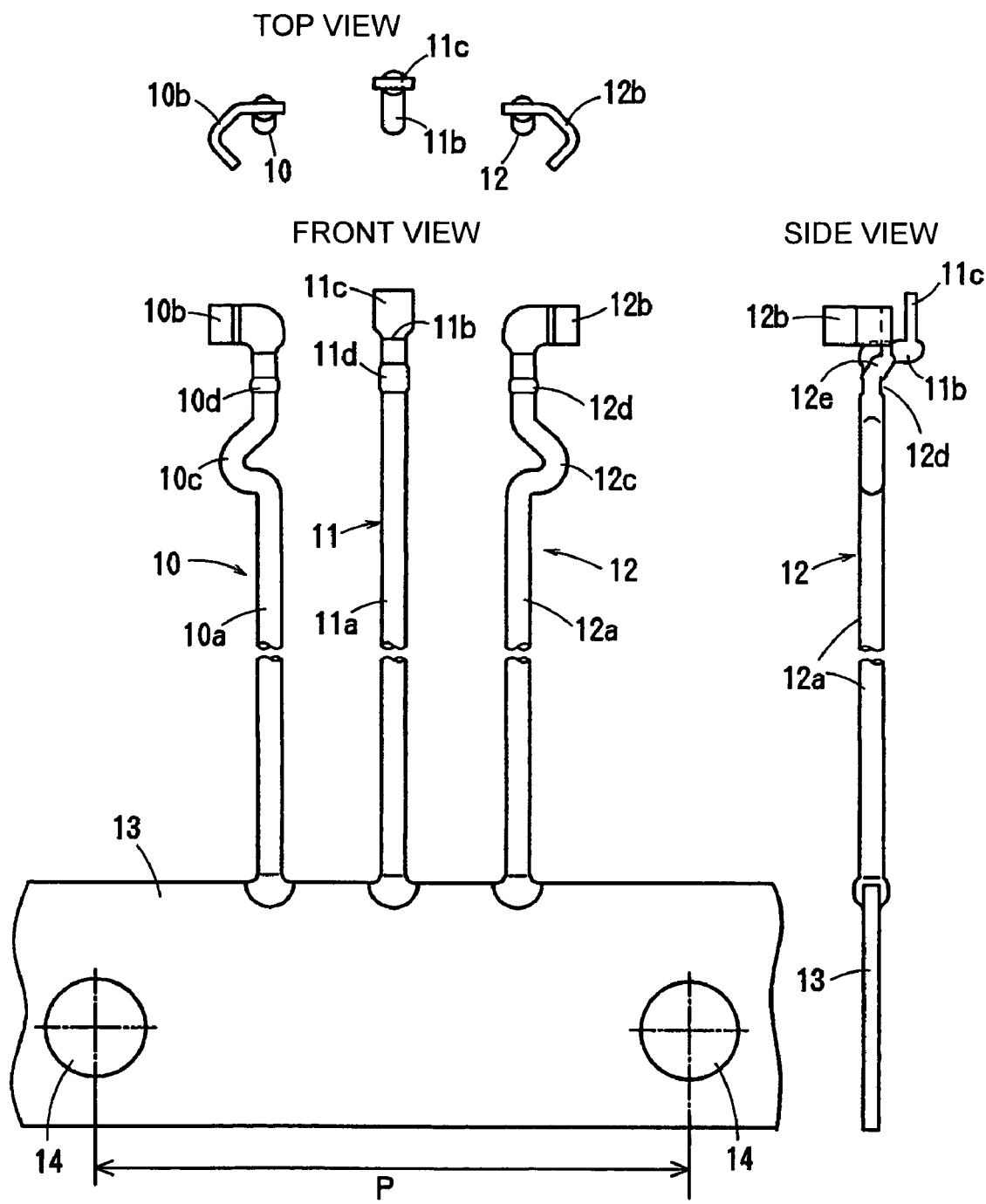

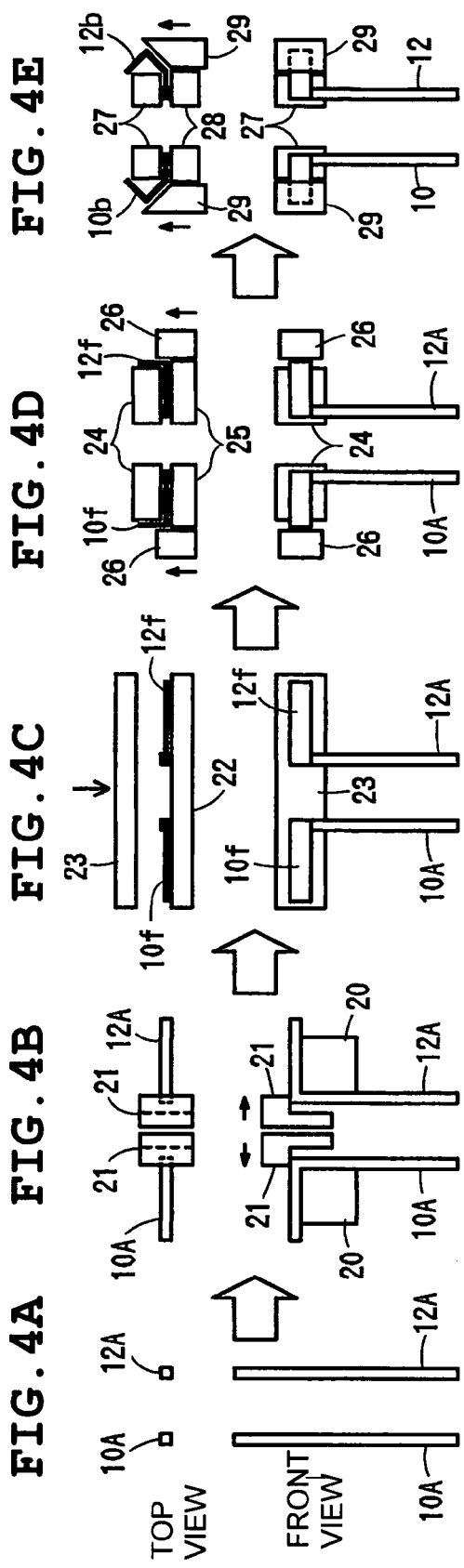

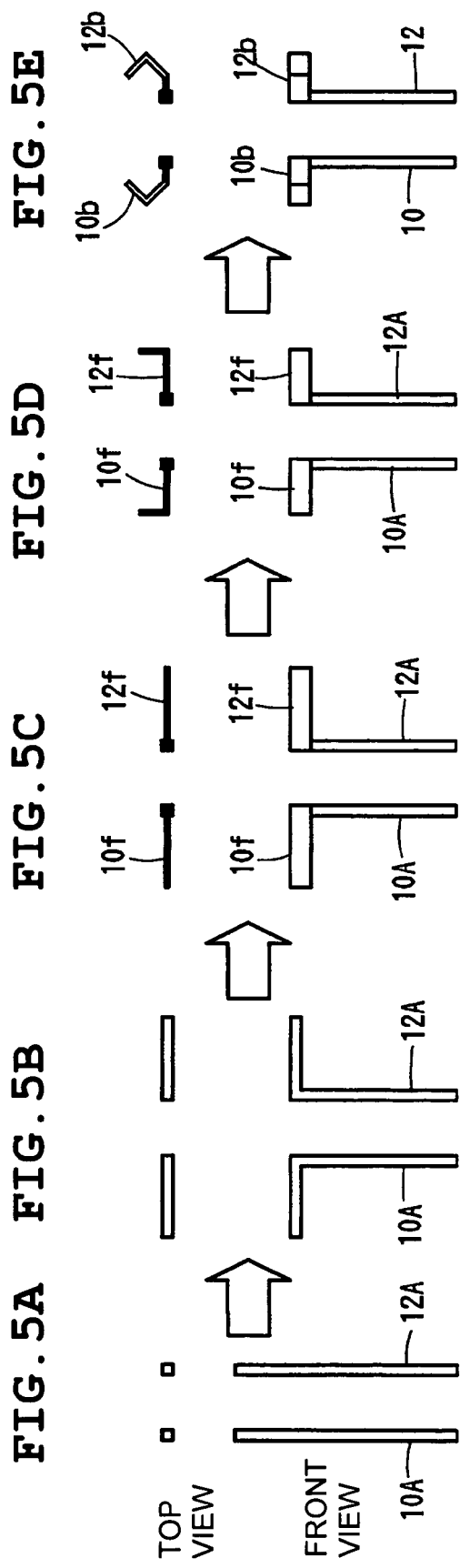

METHOD FOR MANUFACTURING AN ELECTRONIC COMPONENT

This application is a Divisional of U.S. patent application Ser. No. 10/006,698 filed Dec. 10, 2001, now abandoned.

BACKGROUND OF THE INVENTION

1. Field of the Invention

The present invention relates to an electronic component and a method of manufacturing for the electronic component, and more particularly, to an electronic component including a piezoelectric element and at least a pair of lead terminals having cup-shaped holder portions arranged to hold both end portions of the piezoelectric element.

2. Description of the Related Art

An electronic component related to the present invention including a strip-shaped piezoelectric element, a pair of lead terminals having cup-shaped holder portions holding both end portions of the piezoelectric element and connected to both end portions of the piezoelectric element by a conductive joining material, a capacitor substrate connected to the outer surface of the cup-shaped holder portions, and other lead terminals connected to the capacitor substrate are provided, is described in Japanese Examined Patent Application Publication No. 5-33847.

In such an electronic component, it is common to use pressed terminals prepared by stamping a metal plate using dies in order to make cup-shaped lead terminals accurately. The cup-shaped holder portions are formed by an additional treatment of the pressed terminals prepared by stamping. The cup-shaped holder portions formed in this way are excellent for holding piezoelectric elements and have highly reliable conductivity since solder can be used in a stable condition.

However, because they are pressed terminals, a large area of a metal plate is required in order to form cup-shaped holder portions, and accordingly a lot of material loss is caused, and at the same time, since the shape of the cup must be changed when a piezoelectric element of a different kind is to be held by the terminals, different dies are required and, as a result, there is a disadvantage that the material cost and processing cost increase.

On the other hand, an electronic component provided with lead terminals made of a conductive wire having a round section is also described in Japanese Unexamined Patent Application Publication No. 2000-114913. In the electronic component having round lead terminals, there is an advantage that, in contrast to the pressed terminals using a metal plate, the material loss is low and the processing cost is also low. However, in this case, since a V-shaped receiving groove is formed on the side of the round lead terminal and both end portions of a piezoelectric element are inserted in the receiving grooves, the thickness of the piezoelectric element is required to be much thinner than the diameter of the round lead terminals, and there is a problem that the types of piezoelectric elements are restricted. Generally, a round lead wire that is 0.48 mm in diameter is widely used, but piezoelectric elements that can be held by the round wire are very limited. As a result, it is difficult to hold the piezoelectric elements, or it becomes difficult to apply conductive joining materials such as solder, etc., into the receiving grooves, and there is a problem that the capability of holding piezoelectric elements is insufficient and the reliability of conductivity is low.

SUMMARY OF THE INVENTION

In order to overcome the problems described above, preferred embodiments of the present invention provide an electronic component in which linear lead terminals are included and in which the capability of holding piezoelectric elements and the reliability of conductivity are excellent, and a manufacturing method for such a novel electronic component.

According to a first preferred embodiment of the present invention, an electronic component includes a piezoelectric element, and at least a pair of lead terminals having cup-shaped holder portions arranged to hold both end portions of the piezoelectric element. In the electronic component, the cup-shaped holder portions and the electrodes disposed at both end portions of the piezoelectric element are electrically and mechanically connected by a conductive joining material, and the lead terminals are made of a conductive wire, one end portion of the lead terminal is bent outwards at an angle of about 90 degrees, a flat portion is defined by a press extended portion on the tip side from the bending point so as to extend substantially parallel to a lead portion of the lead terminal, and the cup-shaped holder portion is defined by a portion of the flat portion that is bent inwards.

Furthermore, a second preferred embodiment of the present invention provides a manufacturing method for an electronic component, including the steps of preparing a pair of conductive wires, bending one end portion of the conductive wires outwards at an angle of about 90 degrees, forming a flat portion by press extending at least the portion on the tip side from the bending point so as to be extended substantially parallel to a lead portion of the lead terminal, forming a cup-shaped holder portion by bending the flat portion inwards, holding both end portions of a piezoelectric element in a pair of the cup-shaped holder portions, and electrically and mechanically connecting the cup-shaped holder portions and the electrodes formed in both end portions of the piezoelectric element by using a conductive joining material.

In preferred embodiments of the present invention, a conductive wire (for example, a round lead wire) is preferably used as a material of the lead terminals. One end of conductive wires defining a pair is bent outwards, that is, the wires are bent at an angle of about 90 degrees and in opposite directions relative to each other. Next, a flat portion is formed by press extending at least the portion on the tip side from the bending point. This flat portion is rolled so as to be extended substantially parallel to the portion as a lead portion, and the tip portion including the bending point or only the portion from the bending point is rolled. Next, the cup-shaped holder portion is formed by bending the flat portion inwards. The cup-shaped holder portion may be formed by making a substantially U-shaped bend or by a plurality of bending processes for bending the flat portion.

As a conductive wire to be used in preferred embodiments of the present invention, a lead wire having a section with a shape that is not round (for example, substantially square) may be used except a lead wire having a substantially round section.

As a method for forming cup-shaped holder portions, after the tip portion of a conductive wire is rolled flat, the flat portion may be bent outwards at an angle of about 90 degrees. However, it is better to make a bending point different from the flat portion in this case. That is, when the flat portion is bent in the direction of the flat surface, distortion is caused and the shape and dimensional accuracy of the cup cannot be reliably maintained.

As described above, since the cup-shaped holder portion made of a conductive wire is formed so that the end portions of a piezoelectric element is enclosed with the holder portions, when compared with the conventional V-shaped receiving groove, the capability of holding the piezoelectric element is excellent and it is easy to apply solder therein, and accordingly the reliability of conductivity of the electrode of the piezoelectric element is greatly increased.

The width, thickness, and other characteristics of piezoelectric elements included in electronic components are varied, and accordingly the degree of freedom of cup-shaped holder portions is required. In preferred embodiments of the present invention, since the cup-shaped holder portions are formed by press extending the tip portion of a conductive wire flat and bending the flat portion inwards, the inner width and depth of cup-shaped holder portions can be freely changed, even if the piezoelectric element is relatively thick, a cup-shaped holder portion which can hold the piezoelectric element can be easily produced.

Furthermore, in preferred embodiments of the present invention, since the lead terminal itself is made of one lead wire, the material loss is very low, compared with pressed terminals stamped using dies used in conventional devices and methods.

In electronic components including pressed terminals, when the terminals are automatically mounted on a circuit board or other mounting substrate, it is necessary to cut and clinch in a automatic inserter, and then the pressed terminals become thinner. Several disadvantages occur including the cutting capability becomes worse in the automatic inserter and the life of the cutting edge becomes much shorter occurs. On the contrary, when a lead terminal made of a lead wire is used, since the lead portion is linear, the cutting capability is excellent in the automatic inserter and the life of the cutting edge can be greatly prolonged.

As made clear in the present invention, it is better to use a conductive wire having molten solder plated on a surface thereof.

In the case of pressed terminals, a post-treatment step such as electroplating, or other steps, is required after press working in order to increase solderability and, as a result, the cost increases. On the contrary, when a conductive wire having molten solder plated on its surface in advance is used, since the plating on the surface does not peel off during bending and press extending because of the ductility of solder, excellent solderability can be obtained in the final lead terminals. Therefore, no post-treatment is required.

Since no post-treatment is necessary, after terminals are formed, they can be linked in succession to a manufacturing line for products after terminals are formed, and the production time can be shortened.

As made clear in the present invention, it is desirable that the lead portions as the other end of the conductive wires are welded and fixed to a metal hoop material with pilot holds having a fixed distance therebetween.

That is, if linear wires are welded and fixed to the hoop material in advance and cup-shaped holder portions are formed by bending and press extending the conductive wires as described above, the processing of the cup-shaped holder portions is effectively performed. Furthermore, by fixing a plurality of conductive wires to the hoop material, it becomes possible to reliably perform a series of processes such as assembling piezoelectric elements, soldering, coating wax, sealing by using packaging resin, without a break in a line.

Other features, elements, characteristics and advantages of the present invention will become more apparent from the following detailed description of preferred embodiments with reference to the attached drawings.

BRIEF DESCRIPTION OF THE DRAWINGS

FIG. 3 is a front view, top view, and side view of the lead terminals included in the electronic component of FIG. 1;

FIG. 4 is a flow chart showing one example of a processing method for lead terminals according to a preferred embodiment of the present invention; and FIG. 5 is an illustration showing the change of shape of the lead terminals in the flow chart of FIG. 4.

DETAILED DESCRIPTION OF PREFERRED EMBODIMENTS

Figure 1:
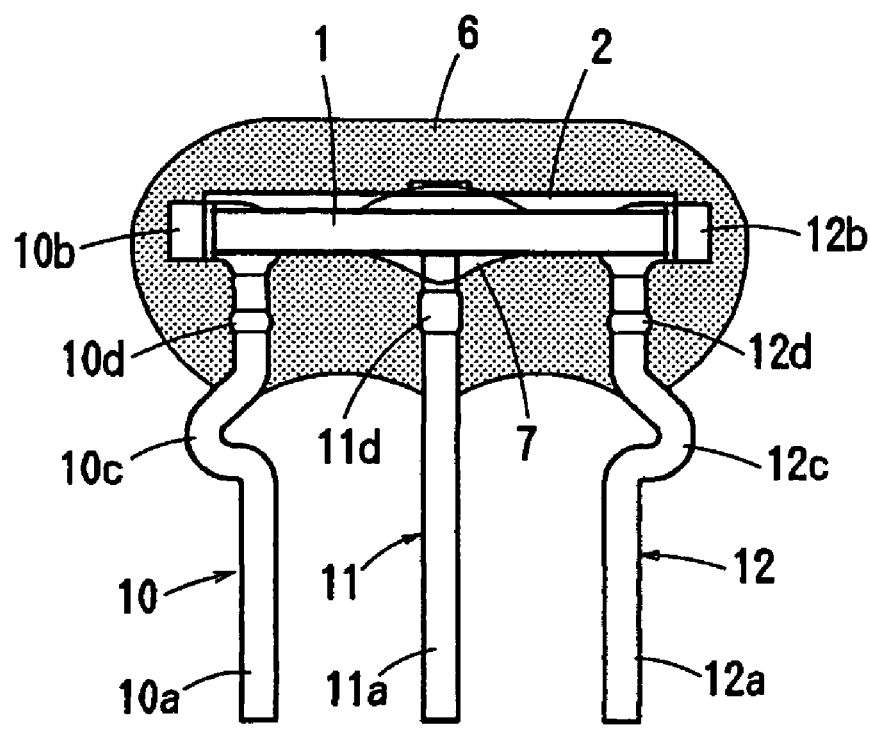
FIG. 1 is a front view showing the internal construction of one example of an electronic component according to a preferred embodiment of the present invention.
Figure 2:
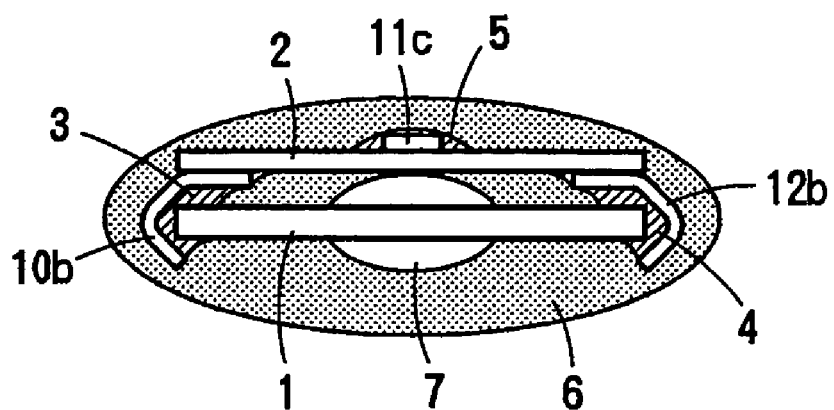
FIG. 2 is a top view of the electronic component shown in FIG. 1.

FIGS. 1 and 2 show one example of an electronic component including lead terminals according to a preferred embodiment of the present invention.

This electronic component is preferably a resonator including a built-in capacitor to be used in, for example, a Colpitts oscillator circuit, and preferably includes a piezoelectric element 1, a capacitor element 2, and three lead terminals 10, 11, and 12 and has a construction where these elements are integrally sealed with a packaging resin 6.

The piezoelectric element 1 is preferably an energy trap thickness shear vibration mode element, which includes a strip-shaped piezoelectric ceramic substrate, an electrode arranged to extend to the middle portion from one end side of the front surface of the substrate, and an electrode arranged to extend to the middle portion from the other end of the back surface of the substrate, and in which both electrodes face each other with the piezoelectric substrate located therebetween in the middle portion.

In the capacitor element 2, a pair of electrodes are disposed at both end portions in the length direction on one main surface of a dielectric substrate made of a material such as ceramics, or other suitable material, and an electrode partially facing the above electrodes is disposed in the middle portion in the length direction on the other main surface.

The piezoelectric element 1 and the capacitor element 2 have a publicly known construction, respectively, as described in, for example, Japanese Examined Patent Application Publication No. 5-33847, and the detailed description thereof is omitted here.

As shown in FIG. 3, the lead terminals 10, 11, and 12 are preferably made of a conductive wire. Here, a round lead wire of about 0.48 mm in diameter, that is, a wire preferably made of a low-carbon steel on the surface of which copper is plated and molten solder is further plated, is preferably used. The tip portion of the lead terminals 10 and 12 on both sides is bent outwards at an angle of about 90 degrees, flat portions are formed by press extending the portions on the tip side from the bending points extended substantially parallel to the lead portions 10a and 12a, and cup-shaped holder portions 10b and 12b are formed by bending these flat portions inwards. The width of the above flat portions is preferably about 0.8 to about 1.0 mm and the thickness is preferably about 0.15 to about 0.2 mm.

Furthermore, the lead terminal 11 in the middle is bent so as to have a step-like configuration (in the side direction) in the transverse direction of the electronic component, and a flat portion 11c is formed by press extending the tip of the bent portion 11b such that the flat portion 11c extends upwards. In the middle portions 10a and 12a of the lead terminals 10 and 12 on both sides, bent stopper portions 10c and 12c are provided to control the stop position when the terminals 10, 12 are inserted into a circuit board.

Furthermore, slightly rolled portions 10d and 12d are formed in the portions on the tip side from the stopper portions 10c and 12c, that is, in the portions constituting the upper end portion of the lead portions 10a to 12a and to be covered by the packaging resin 6. These portions 10*d* to 12*d* are provided in order to prevent solder and soldering flax from entering the inside of the packaging resin 6 when the electronic component is mounted.

As clearly understood from the side view in FIG. 3, bending portions 10*e* and 12*e* bent in the same direction as the bending portion 11*b* of the lead wire 11 in the middle are provided at the locations right before the cup-shaped holder portions 10*b* and 12*b* of the lead terminals 10 and 12 on both sides. Because of the bending portions 10*e* and 12*e*, the piezoelectric element 1 held by the cup-shaped holding portions 10*b* and 12*b* is located very close to the lead terminal 11 in the middle and the bottom surface of the piezoelectric element 1 is supported by the bending portion 11*b* of the lead terminal 11. In the same way, the bottom surface of the capacitor element 2 is also supported by the bending portion 11*b* of the lead terminal 11 in the middle. Therefore, in the stage before soldering, the position of the piezoelectric element 1 and the capacitor element 2 is positionally stabilized and soldering is made easy.

Both end portions of the piezoelectric element 1 are held by the cup-shaped holder portions 10*b* and 12*b* of the lead terminals 10 and 12, the piezoelectric element 1 is mechanically fixed by pouring a conductive joining material such as solder into the cup-shaped holder portions 10*b* and 12*b*, and the electrodes located at both end portions of the piezoelectric element 1 are simultaneously electrically connected to the cup-shaped holder portions 10*b* and 12*b*.

The capacitor element 2 is held between the cup-shaped holder portions 10*b* and 12*b* and the tip portion 11*b* of the lead terminal 11 in the middle and is electrically and mechanically connected to the holder portions 10*b* and 12*b* by the above-mentioned conductive joining materials 3 and 4 and is also connected to the lead terminal 11 by another conductive joining material 5.

After the piezoelectric element 1 and the capacitor element 2 are fixed to the three lead terminals 10 to 12, the vibrating portion (central portion) of the piezoelectric element 1 is preferably coated with wax and its surroundings are coated with the packaging resin 6, and then a cavity 7 is defined to surround the vibrating portion of the piezoelectric element 1 by causing the wax to be absorbed when the packaging resin 6 is hardened.

As shown in FIG. 3, a plurality of groups of the lead portions 10*a* to 12*a* of the lead terminals 10 and 12 as a set of three is welded and fixed to a long hoop material with a fixed distance therebetween. When the manufacture of the electronic component is finished, the lead terminals 10 and 12 are separated from the hoop material, but during a series of processes such as forming the lead terminals 10 to 12, soldering the piezoelectric element 1 and the capacitor element 2, coating of wax, sealing by the packaging resin, and other processes, the lead terminals 10 and 12 are transported in the manufacturing line while they are fixed to the hoop material 13. At that time, pilot holes 14 are formed in the hoop material 13 with a fixed distance therebetween in order to position the hoop material correctly.

Next, one example of a method for forming the lead terminals 10 and 12 shown in FIG. 3 is described based on FIGS. 4 and 5.

FIG. 4 is a flow chart for forming lead terminals by using dies, and FIG. 5 shows the change of shape of the lead terminals.

In FIGS. 4 and 5, A shows a process for preparing a pair of lead wires 10A and 12A. Here, a lead wire having a substantially square section is used, but a substantially round lead wire may be used.

B shows a process for bending the tip portion of the lead wires 10A and 12A outwards at an angle of about 90 degrees by using supporting dies 20 and bending dies 21.

C shows a process for forming flat portions 10*f* and 12*f* by press extending the portions including the bending point on the tip side of the lead wires 10A and 12A which are bent at an angle of about 90 degrees, so as to be extended substantially parallel to the lead portions 10*a* and 12*a* using a pair of press extending dies 22 and 23.

D shows a process for bending the rolled flat portions 10*f* and 12*f* at an angle of about 90 degrees towards the thickness direction at the location about one third away from the tip of the flat portions 10*f* and 12*f* by using bending dies 26 while the rolled flat portions 10*f* and 12*f* are held between a pair of dies 24 and 25.

E shows a process for bending the flat portions 10*f* and 12*f* at an angle of about 45 degrees towards the thickness direction at the location about two thirds away from the tip of the flat portions 10*f* and 12*f* by bending dies 29 while the flat portions 10*f* and 12*f* are held between a pair of dies 27 and 28.

Through the above processes, as shown in E of FIG. 5, the cup-shaped holder portions 10*b* and 12*b* facing each other are disposed at the tip portions of a pair of the lead terminals 10 and 12. When the holder portions 10*b* and 12*b* are formed by bending the flat portions 10*e* and 12*e* in the thickness direction twice as described above, the number of processes is reduced and the dies also become simple.

In the above-described preferred embodiment, an electronic component in which a piezoelectric element and a capacitor element are fixed to three lead terminals is described, but an electronic component in which a piezoelectric element is fixed between two lead terminals and no capacitor element is provided may also be produced.

Furthermore, regarding the lead terminals, each respective one end portion is bent outwards at an angle of about 90 degrees and the flat portion is formed by press extending the portion including the bending point on the tip side, but the flat portion may be formed by the portion excluding the bending point on the tip side.

Moreover, the sequence for forming the lead terminals is not limited to that shown in FIGS. 4 and 5, and after the tip portion of the lead wires is rolled flat, the lead wires are bent outwards at an angle of about 90 degrees at the portion which is not rolled and then the flat portion may be formed to be cup-shaped.

As clearly understood from the above description, according to the first preferred embodiment of the present invention, the cup-shaped holder portions are preferably formed by using a conductive wire material and the holder portions have a configuration that encloses the end portions of a piezoelectric element. Therefore, when compared with lead wires with a V-shaped receiving groove, the holder portions have an excellent holding function for the piezoelectric element and it is easy to apply solder inside. As a result, the reliability of conductivity to the electrodes of the piezoelectric element is greatly increased.

Furthermore, even if the piezoelectric element has a different width and thickness, since the inner width and depth of the cup-shaped holder portions can be freely changed by simply changing the bending location of the lead wires, the cup-shaped holder portions can be applied to various types of piezoelectric elements resulting in low cost.

Furthermore, when compared with pressed terminals prepared by stamping dies, since the lead terminal itself is made of a single lead wire, the material loss is extremely low.

Moreover, since the lead terminal is made of a lead wire, it is easily cut in an automatic insertion machine and the life of the cutting edge can be greatly prolonged.

Furthermore, when a manufacturing method according to a second preferred embodiment of the present invention is used, an electronic component according to the first preferred embodiment of the present invention can be manufactured simply and at low cost.

While preferred embodiments of the invention have been described above, it is to be understood that variations and modifications will be apparent to those skilled in the art without departing the scope and spirit of the invention. The scope of the invention, therefore, is to be determined solely by the following claims.

The invention claimed is:

1. A method for manufacturing an electronic component, comprising the steps of:
    preparing a pair of substantially round conductive wires defining a pair of lead terminals;
    bending one end portion of each of the pair of conductive wires outwards at an angle of about 90 degrees;
    forming a flat portion on each of the pair of substantially round conductive wires by press extending at least the portion on a tip side from the bending point so as to be extended substantially parallel to a lead portion of a respective one of the pair of lead terminals, such that a thickness of the flat portion is less than a diameter of each of the pair of substantially round conductive wires;
    forming a cup-shaped holder portion by bending the flat portion inward;
    holding both end portions of a piezoelectric element in a pair of the cup-shaped holder portions; and
    electrically and mechanically connecting the cup-shaped holder portions and the electrodes formed in both end portions of the piezoelectric element by using a conductive joining material.

2. A method for manufacturing an electronic component as claimed in claim 1, further comprising the step of plating molten solder on each of the pair of conductive wires.

3. A method for manufacturing an electronic component as claimed in claim 1, wherein the lead portions at the other end of each of the pair of conductive wires are welded and fixed to a metal hoop material with pilot holds having a fixed distance therebetween.

4. A method for manufacturing an electronic component as claimed in claim 1, wherein the step of bending one end portion of each of the pair of conductive wires outwards at an angle of about 90 degrees is done at a location about two thirds away from the tip of the flat portions.

5. A method for manufacturing an electronic component as claimed in claim 1, further comprising the step of providing a capacitor element between the cup-shaped holder portions and a tip portion of one of the lead terminals, and electrically and mechanically connecting the capacitor to the holder portions via the conductive joining material.

6. A method for manufacturing an electronic component as claimed in claim 1, further comprising the step of integrally sealing the piezoelectric element, the pair of lead terminals and the conductive joining material in a packaging resin.

7. A method for manufacturing an electronic component according to claim 1, wherein the electronic component is a resonator.

8. A method for manufacturing an electronic component according to claim 1, wherein the piezoelectric element is an energy trap thickness shear vibration mode element.

9. A method for manufacturing an electronic component according to claim 1, wherein each of the lead terminals are made of a round lead wire of about 0.48 mm in diameter.

10. A method for manufacturing an electronic component according to claim 1, wherein each of the lead terminals includes a wire made of a low-carbon steel and having copper plated on a surface thereof and a molten solder plated on the copper plating.

11. A method for manufacturing an electronic component according to claim 1, wherein a width of the flat portions is about 0.8 mm to about 1.0 mm and a thickness of the flat portions is about 0.15 mm to about 0.2 mm.

* * * * *